(12) United States Patent
Ahn et al.

(10) Patent No.: US 10,608,102 B2
(45) Date of Patent: Mar. 31, 2020

(54) SEMICONDUCTOR DEVICE HAVING A DRAIN ELECTRODE CONTACTING AN EPI MATERIAL INSIDE A THROUGH-HOLE AND METHOD OF MANUFACTURING THE SAME

(71) Applicant: ELECTRONICS AND TELECOMMUNICATIONS RESEARCH INSTITUTE, Daejeon (KR)

(72) Inventors: Hokyun Ahn, Daejeon (KR); Min Jeong Shin, Daejeon (KR); Jeong Jin Kim, Jeonju-si (KR); Hae Cheon Kim, Daejeon (KR); Jae Won Do, Daejeon (KR); Byoung-Gue Min, Sejong-si (KR); Hyung Sup Yoon, Daejeon (KR); Hyung Seok Lee, Daejeon (KR); Jong-Won Lim, Daejeon (KR); Sungjae Chang, Daejeon (KR); Hyunwook Jung, Daejeon (KR); Kyu Jun Cho, Daejeon (KR); Dong Min Kang, Daejeon (KR); Dong-Young Kim, Daejeon (KR); Seong-Il Kim, Daejeon (KR); Sang-Heung Lee, Daejeon (KR); Jongmin Lee, Daejeon (KR); Hong Gu Ji, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/137,235

(22) Filed: Sep. 20, 2018

(65) Prior Publication Data

US 2019/0103483 A1 Apr. 4, 2019

(30) Foreign Application Priority Data

Sep. 29, 2017 (KR) .................. 10-2017-0128070
Apr. 20, 2018 (KR) .................. 10-2018-0046336

(51) Int. Cl.
*H01L 29/78* (2006.01)
*H01L 29/45* (2006.01)
(Continued)

(52) U.S. Cl.
CPC ...... *H01L 29/7802* (2013.01); *H01L 21/3065* (2013.01); *H01L 29/0649* (2013.01);
(Continued)

(58) Field of Classification Search
CPC ......... H01L 29/66431; H01L 29/66462; H01L 29/778–7789; H01L 29/20;
(Continued)

(56) References Cited

U.S. PATENT DOCUMENTS 9,590,088 B2 3/2017 Chowdhury et al.
9,741,842 B2 8/2017 Pala et al.
(Continued)

FOREIGN PATENT DOCUMENTS

KR 10-1343770 B1 12/2013

OTHER PUBLICATIONS

Saptarshi Mandal et al, "Dispersion Free 450-V p GaN-Gated CAVETs With Mg-ion Implanted Blocking Layer", IEEE Electron Device Letters, vol. 38, No. 7, Jul. 2017, p. 933-936.
(Continued)

*Primary Examiner* — Younes Boulghassoul
(74) *Attorney, Agent, or Firm* — Rabin & Berdo, P.C.

(57) ABSTRACT

Provided is a semiconductor device including a substrate in which an insulation layer is disposed between a first semiconductor layer and a second semiconductor layer, a through-hole penetrating through the substrate, the through-hole having a first hole penetrating through the first semiconductor layer and a second hole penetrating through the insulation layer and the second semiconductor layer from a bottom surface of the first hole, an epi-layer disposed inside
(Continued)

the through-hole, a drain electrode disposed inside the second hole and contacting one surface of the epi-layer, and a source electrode and a gate electrode which are disposed on the other surface of the epi-layer.

15 Claims, 7 Drawing Sheets

(51) Int. Cl.
    *H01L 29/778* (2006.01)
    *H01L 29/66* (2006.01)
    *H01L 21/3065* (2006.01)
    *H01L 29/417* (2006.01)
    *H01L 29/06* (2006.01)
    *H01L 29/20* (2006.01)
    *H01L 29/423* (2006.01)

(52) U.S. Cl.
    CPC .. *H01L 29/41741* (2013.01); *H01L 29/41766* (2013.01); *H01L 29/42356* (2013.01); *H01L 29/452* (2013.01); *H01L 29/66462* (2013.01); *H01L 29/66712* (2013.01); *H01L 29/7788* (2013.01); *H01L 29/2003* (2013.01)

(58) Field of Classification Search
    CPC . H01L 29/2003; H01L 29/201; H01L 29/205; H01L 2924/13064; H01L 29/66712–66734; H01L 29/7802–7815; H01L 29/0649; H01L 29/7788; H01L 29/7812
    See application file for complete search history.

(56) References Cited

U.S. PATENT DOCUMENTS

| | | |
|---|---|---|
| 2007/0018210 A1 | 1/2007 | Sheppard |
| 2008/0128862 A1* | 6/2008 | Sugimoto ........... H01L 29/0649 257/615 |
| 2009/0134402 A1* | 5/2009 | Yatsuo ................ H01L 21/0465 257/77 |
| 2009/0134456 A1* | 5/2009 | Sugimoto ........... H01L 29/0649 257/329 |
| 2009/0315037 A1* | 12/2009 | Kikkawa ............. H01L 29/0649 257/76 |
| 2010/0038681 A1* | 2/2010 | Sugimoto ........... H01L 29/0642 257/194 |
| 2011/0057233 A1* | 3/2011 | Park .................... H01L 29/1033 257/194 |
| 2011/0084284 A1* | 4/2011 | Zhang ................. H01L 29/0623 257/77 |
| 2012/0319127 A1* | 12/2012 | Chowdhury ...... H01L 29/66204 257/76 |
| 2013/0228795 A1* | 9/2013 | Ohki ................... H01L 29/0653 257/76 |
| 2014/0017885 A1 | 1/2014 | Yoon et al. |
| 2014/0159049 A1 | 6/2014 | Ko et al. |
| 2015/0021664 A1* | 1/2015 | Simin ................. H01L 29/7788 257/192 |
| 2015/0249150 A1* | 9/2015 | Yamaguchi ........ H01L 29/66462 257/76 |
| 2015/0270356 A1* | 9/2015 | Palacios ............ H01L 21/02458 257/76 |
| 2018/0315844 A1* | 11/2018 | Chen .................... H01L 29/267 |

OTHER PUBLICATIONS

Dong Ji et al., "Normally OFF Trench CAVET With Active Mg-Doped GaN as Current Blocking Layer", IEEE Transactions on Electron Devices, vol. 64, No. 3, Mar. 2017, p. 805-808.

Eizo Mitani et al., "Mass-Production of High-Voltage GaAs and GaN Devices", CS Mantech Conference, Apr. 24-27, 2006, p. 183-186.

* cited by examiner

SEMICONDUCTOR DEVICE HAVING A DRAIN ELECTRODE CONTACTING AN EPI MATERIAL INSIDE A THROUGH-HOLE AND METHOD OF MANUFACTURING THE SAME

CROSS-REFERENCE TO RELATED APPLICATIONS

This U.S. non-provisional patent application claims priority under 35 U.S.C. § 119 of Korean Patent Application Nos. 10-2017-0128070, filed on Sep. 29, 2017, and 10-2018-0046336, filed on Apr. 20, 2018, the entire contents of which are hereby incorporated by reference.

BACKGROUND

The present disclosure herein relates to a semiconductor device and a method for manufacturing the same, and more particularly, to a vertical-type semiconductor device and a method for manufacturing the same.

With development of information and communication technology, high breakdown voltage transistors operating at a high speed switching environment and a high voltage environment are increasingly in demand. In response to such a demand, recently emerging gallium nitride (GaN)-based transistors in which III-V group semiconductor materials are applied can exhibit a high speed switching operation and are thus suitable for ultra-high-speed signal processing, and also can be applied in a high voltage environment with assistance of high-voltage characteristics inherent in their own materials, as compared with typical silicon transistors. Therefore, these transistors have attracted great attentions from the corresponding industries.

These gallium nitride-based transistors can be manufactured having a horizontal structure or a vertical structure. The horizontal structure has a configuration in which charge conduction of a nitride-based transistor is formed horizontally, and a source electrode, a gate electrode, and a drain electrode are disposed on the same surface of a substrate. The vertical structure has a configuration in which charge conduction is formed vertically. In the vertical structure, a source electrode and a drain electrode are disposed facing each other vertically, and current flows from the source electrode to the drain electrode through an aperture of p-type gallium nitride (p-GaN) layer that is provided as a current barrier layer between the source electrode and the drain electrode.

SUMMARY

The present disclosure provides a method for manufacturing a semiconductor device, the method having simplified processes.

The present disclosure also provides a semiconductor device having a simplified structure.

The purpose of the present disclosure is not limited to the aforesaid, but other purposes not described herein will be clearly understood by those skilled in the art from descriptions below.

An embodiment of the inventive concept provides a semiconductor device including: a substrate in which an insulation layer is disposed between a first semiconductor layer and a second semiconductor layer; a through-hole penetrating through the substrate, the through-hole having a first hole penetrating through the first semiconductor layer and a second hole penetrating through the insulation layer and the second semiconductor layer from a bottom surface of the first hole; an epi-layer disposed inside the through-hole; a drain electrode disposed inside the second hole and contacting one surface of the epi-layer; and a source electrode and a gate electrode which are disposed on the other surface of the epi-layer.

In an embodiment, a bottom surface of the epi-layer may be positioned at a level lower than the insulation layer. A top surface of the epi-layer may be positioned at a level higher than the insulation layer.

In an embodiment, the epi-layer may include an ohmic contact layer, a drift layer, a channel layer, and a barrier layer, which are sequentially stacked from the drain electrode.

In an embodiment, the drift layer may be disposed at a boundary between the first hole and the second hole. A top surface of the drift layer may be positioned at a level higher than the insulation layer. A bottom surface of the drift layer may be positioned at a level lower than the insulation layer.

In an embodiment, the channel layer may be disposed at a boundary between the first hole and the second hole. A top surface of the channel layer may be positioned at a level higher than the insulation layer. A bottom surface of the channel layer may be positioned at a level lower than the insulation layer.

In an embodiment, the barrier layer may include AlGaN, AlN, InN, InAlN, or AlGaInN. The channel layer may include GaN.

In an embodiment, the semiconductor device may further include a spacer layer disposed between the epi-layer and an inner wall of the through hole.

In an embodiment, a width of the first hole may be greater than a width of the second hole.

In an embodiment of the inventive concept, a method for manufacturing a semiconductor device includes: providing a substrate in which an insulation layer is disposed between a first semiconductor layer and a second semiconductor layer; etching the second semiconductor layer to form a first hole that exposes the insulation layer; etching the exposed insulation layer to form a second hole that extends into the first semiconductor layer; growing an epi-layer on a bottom surface of the second hole; forming a source electrode and a gate electrode on a top surface of the epi-layer; etching the first semiconductor layer to form a third hole that is connected to the second hole; and forming a drain electrode that extends from one surface of the first semiconductor layer into the third hole and contacts the epi-layer.

In an embodiment, before forming of the epi-layer, the method may further include forming a spacer layer that covers an inner wall and a bottom surface of the first hole and an inner wall of the second hole.

In an embodiment, the epi-layer may include a buffer layer, an ohmic contact layer, a drift layer, a channel layer, and a barrier layer, which are sequentially stacked from the bottom surface of the second hole.

In an embodiment, during etching of the first semiconductor layer to form the third hole, the buffer layer may be removed together.

In an embodiment, a boundary surface between the channel layer and the barrier layer may be disposed at a level higher than the insulation layer.

In an embodiment, before forming of the third hole, the method may further include polishing the first semiconductor layer.

In an embodiment, a width of the first hole may be greater than a width of the second hole.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
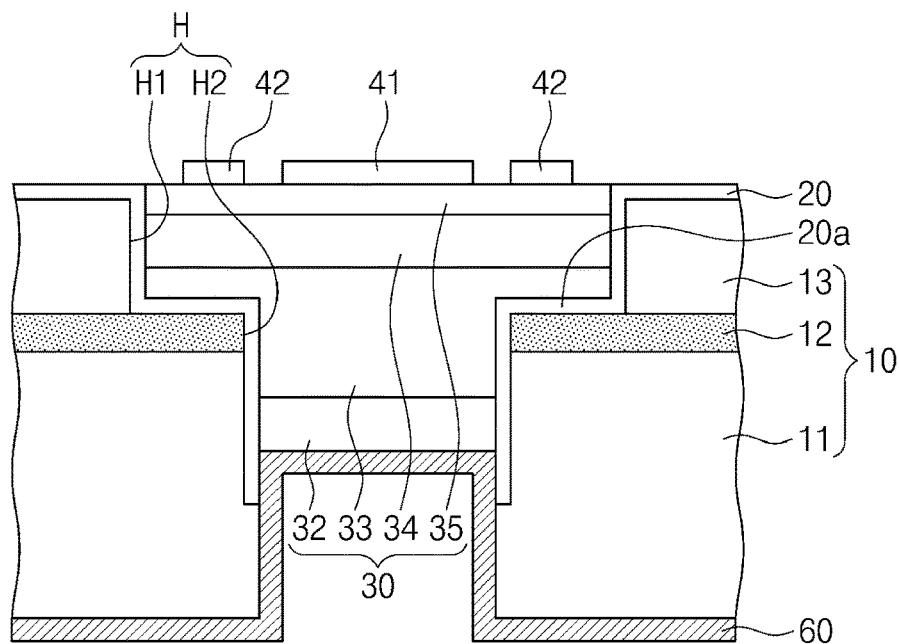
FIG. 1 is a cross-sectional view for explaining a semiconductor device according to embodiments of the inventive concept.

Preferred embodiments of the inventive concept will be described with reference to the accompanying drawings so as to sufficiently understand constitutions and effects of embodiments of the inventive concept. The present disclosure may, however, be embodied in different forms with various changes and should not be construed as limited to the embodiments set forth herein. Rather, these embodiments are provided so that this disclosure will be thorough and complete, and will fully convey the scope of the present disclosure to those skilled in the art. A person with ordinary skill in the art to which the present disclosure pertains will understand that the inventive concept can be carried out under any appropriate condition.

In this specification, the terms are used only for explaining embodiments while not limiting the present disclosure. In this specification, the singular forms are intended to include the plural forms as well, unless the context clearly indicates otherwise. It will be understood that the terms 'comprises' and/or 'comprising', when used in this specification, specify the presence of stated components, steps, operations and/or elements, but do not exclude the presence or addition of one or more other components, steps, operations and/or elements.

In the specification, it will be understood that when a film (or layer) is referred to as being 'on' another film (or layer) or substrate, it can be directly on another film (or layer) or substrate, or intervening layers may also be present.

It will be understood that, although the terms first, second, third, etc. may be used herein to describe various regions, films (or layers), or the like, these regions and films should not be limited by these terms. These terms are used only to distinguish a predetermined region or film (or layer) from another region or film (or layer). Therefore, a layer referred to as a first layer in one embodiment can be referred to as a second layer in another embodiment. Each embodiment described and exemplified herein also includes a complementary embodiment thereof. Like reference numerals refer to like elements throughout.

Unless otherwise defined, all terms used in embodiments of the inventive concept have the same meaning as commonly understood by one of ordinary skill in the art to which the present disclosure belongs.

Hereinafter, a semiconductor device and a method for manufacturing the same according to the inventive concept will be described with reference to the drawings.

FIG. 1 is a cross-sectional view for explaining a semiconductor device according to embodiments of the inventive concept.

Referring to FIG. 1, a substrate 10 may be provided. The substrate 10 may be a silicon on insulator (SOI) substrate. For example, the substrate 10 may include a first semiconductor layer 11, an insulation layer 12, and a second semiconductor layer, 13 which are sequentially stacked. The insulation layer 12 may be disposed between the first semiconductor layer 11 and the second semiconductor layer 13. The first semiconductor layer 11 may include silicon (Si), aluminum nitride (AlN), silicon carbide (SiC), and sapphire. The insulation layer 12 may include silicon oxide ($SiO_2$) or rare earth oxide. The second semiconductor layer 13 may include silicon (Si), gallium nitride (GaN), or silicon carbide (SiC). The first semiconductor layer 11 and the second semiconductor layer 13 may include the same material. On the other hand, the first semiconductor layer 11 and the second semiconductor layer 13 may include different materials, or have the same material but with different crystallization directions. In addition, the substrate 10 may include various SOI substrates.

The substrate 10 may have a through-hole H. The through-hole H may vertically penetrate through the first semiconductor layer 11, the insulation layer 12, and the second semiconductor layer 13. The through-hole H may include a first hole H1 that penetrates through the second semiconductor layer 13 and a second hole H2 that penetrates through an insulation layer 12 and the first semiconductor layer 11. The second hole H2 may have a smaller width than the first hole H1. The first hole H1 and the second hole H2 overlap each other vertically. The second hole H2 extends from a bottom surface of the first hole H1 toward a bottom surface of the first semiconductor layer 11, and the first hole H1 and the second hole H2 may be connected to each other. That is, the through-hole H may be in a bolt shape generally having a wider upper portion and a narrow lower portion.

Inside the through-hole H, a spacer layer 20 may be disposed. The spacer layer 20 may conformally cover an inner wall and the bottom surface of the first hole H1 and an inner wall of the second hole H2. Here, a portion of the inner wall of the second hole H2 may be exposed. The spacer layer 20 may extend over a top surface of the second semiconductor layer 13. The spacer layer 20 may include silicon nitride ($SiN_x$). In some cases, the spacer layer 20 may be omitted.

Inside the through-hole H, an epi-layer 30 may be disposed. The first hole H1 may be filled partially with the epi-layer 30, and the second hole H2 may be filled therewith. Here, a top surface of the epi-layer 30 may be positioned at a level higher than the insulation layer 12, and a bottom surface of the epi-layer 30 may be positioned at a level lower than the insulation layer 12. The epi-layer 30 may be spaced apart from the substrate 10 by the spacer layer 20. The epi-layer 30 may include an ohmic contact layer 32, a drift layer 33, a channel layer 34, and a barrier layer 35.

Figure 2:
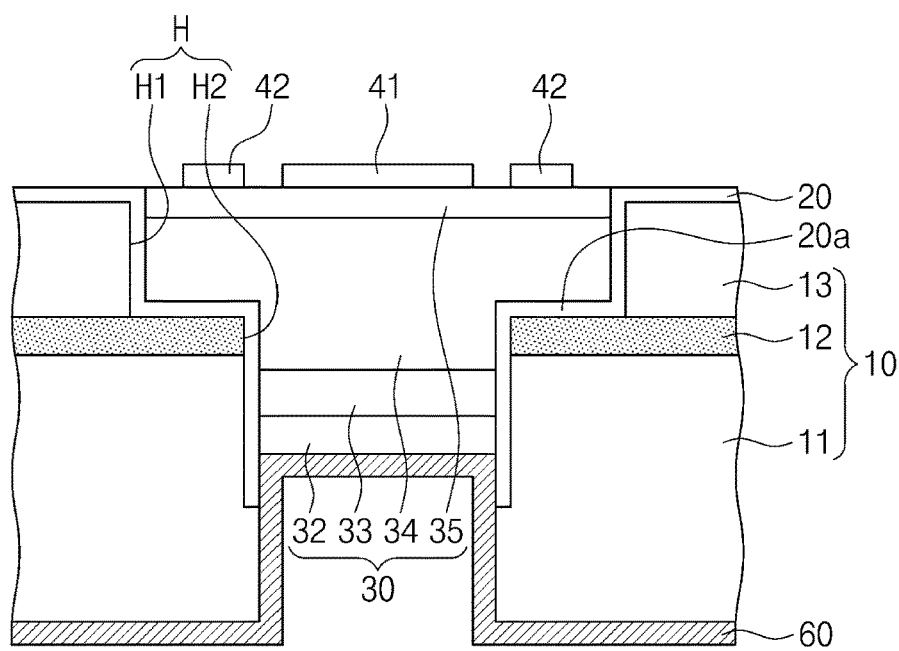
FIG. 2 is a cross-sectional view for explaining a semiconductor device according to embodiments of the inventive concept.

The ohmic contact layer 32, the drift layer 33, a channel layer 34, and a barrier layer 35 may be sequentially stacked in a direction from the first semiconductor layer 11 toward the semiconductor layer 13. The ohmic contact layer 32 may be disposed inside the second hole H2, and the channel layer 34 and the barrier layer 35 may be disposed inside the first hole H1. The drift layer 33 is disposed at a boundary between the first hole H1 and the second hole H2, wherein a top surface thereof may be positioned at a level higher than the insulation layer 12 and a bottom surface thereof may be positioned at a level lower than the insulation layer 12. Alternatively, as illustrated in FIG. 2, the top surface of the drift layer 33 may be positioned at a level lower than the insulation layer 12. The channel layer 34 is disposed at a boundary between the first hole H1 and the second hole H2, wherein a top surface thereof may be positioned at a level higher than the insulation layer 12 and a bottom surface thereof may be positioned at a level lower than the insulation layer 12. Hereinafter, the description will be continued on the basis of an embodiment in FIG. 1.

The ohmic contact layer 32 may be formed of $n^+$-type gallium nitride ($n^+$-GaN). The ohmic contact layer 32 may be in an ohmic contact with each of the drift layer 33 and a drain electrode 60 that will be described later. The drift layer 33 may be formed of n-type gallium nitride (n-GaN). In the ohmic contact layer 32 and the drift layer 33, an n-type dopant may include silicon (Si). The channel layer 34 may be formed of gallium nitride (GaN). The barrier layer 35 may be formed of aluminum gallium nitride (AlGaN). By the heterojunction of the channel layer 34 and the barrier layer 35, a channel with the 2-dimensional electron gas (2-DEG) type may be provided at a boundary between the channel layer 34 and the barrier layer 35. Here, a boundary surface between the channel layer 34 and the barrier layer 35, that is, the channel may be positioned at a level higher than the insulation layer 12. Although it has been described about having heterojunction between the channel layer 34 having the gallium nitride (GaN) and the barrier layer 35 having the aluminum gallium nitride (AlGaN), the embodiment of the inventive concept is not limited thereto. The channel layer 34 and the barrier layer 35 may include various materials having the heterojunction for the channel. For example, when the channel layer 34 includes gallium nitride (GaN), the barrier layer 35 may include aluminum gallium nitride (AlGaN), aluminum nitride (AlN), indium nitride (InN), indium aluminum nitride (InAlN), or aluminum gallium indium nitride (AlGaInN). Alternatively, when the channel layer 34 includes gallium arsenide (GaAs), the barrier layer 35 may include aluminum gallium arsenide (AlGaAs) or indium gallium arsenide (InGaAs).

Although not illustrated, a capping layer may be disposed on the epi-layer 30. The capping layer may include gallium nitride (GaN). In some cases, the capping layer may be not provided.

The drain electrode 60 may be disposed on the bottom surface of the epi-layer 30. For example, the drain electrode 60 may extend from the bottom surface of the first semiconductor layer 11 to the second hole H2, and contact the ohmic contact layer 32. The bottom surface of the substrate 10 and the bottom surface of the ohmic contact layer 32 may be covered conformally. The drain electrode 60 may be in an ohmic contact with the ohmic contact layer 32. The drain electrode 60 may include a metal.

On the epi-layer 30, a gate electrode 41 and source electrodes 42 may be disposed. The gate electrode 41 may be disposed between the source electrodes 42. Each of the gate electrode 41 and the source electrodes 42 may be in an ohmic contact with the barrier layer 35. For one example, when the channel layer 34 include gallium nitride (GaN), the gate electrode 41 and the source electrodes 42 may be formed of a multi-layered metal film including titanium (Ti), platinum (Pt), aluminum (Al), nickel (Ni), or gold (Au). Alternatively, when the channel layer 34 include gallium arsenide (GaAs), the gate electrode 41 and the source electrodes 42 may be formed of a multi-layered metal film including gold germanium (AuGe), nickel (Ni), or gold (Au). The gate electrode 41 may control an amount of current flowing from the source electrodes 42 toward the drain electrode 60.

In the semiconductor device according to embodiments of the inventive concept, the epi-layer 30 is provided penetrating through the insulation layer 12 of the substrate 10, and thus a current blocking layer for allowing the current to vertically flow between the source electrodes 42 and the drain electrode 60 may be unnecessary. Also, when the first semiconductor layer 11 and the second semiconductor layer 13 of the substrate 10 include different materials, hetero semiconductor devices may be integrated on respective surfaces of the first and second semiconductor layers 11 and 13.

FIGS. 3 to 11 are cross-sectional views for explaining a method for manufacturing a semiconductor device according to embodiments of the inventive concept. For convenience of explanation, descriptions for the same components as described with reference to FIG. 1 may be omitted.

Figure 3:
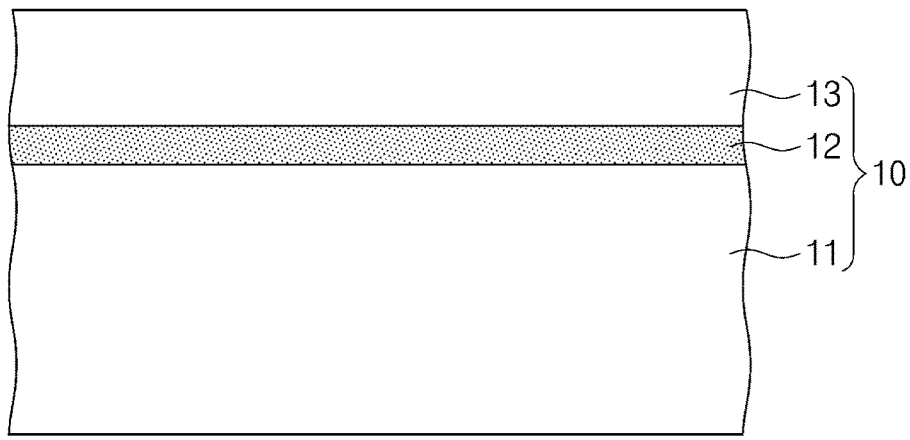
FIGS. 3 to 11 are cross-sectional views for explaining a method for manufacturing a semiconductor device according to embodiments of the inventive concept.

Referring to FIG. 3, a substrate 10 may be provided. The substrate 10 may be a silicon on insulator (SOI) substrate. For example, the substrate 10 may include an insulation layer 12 disposed between a first semiconductor layer 11 and a second semiconductor layer 13.

Figure 4:
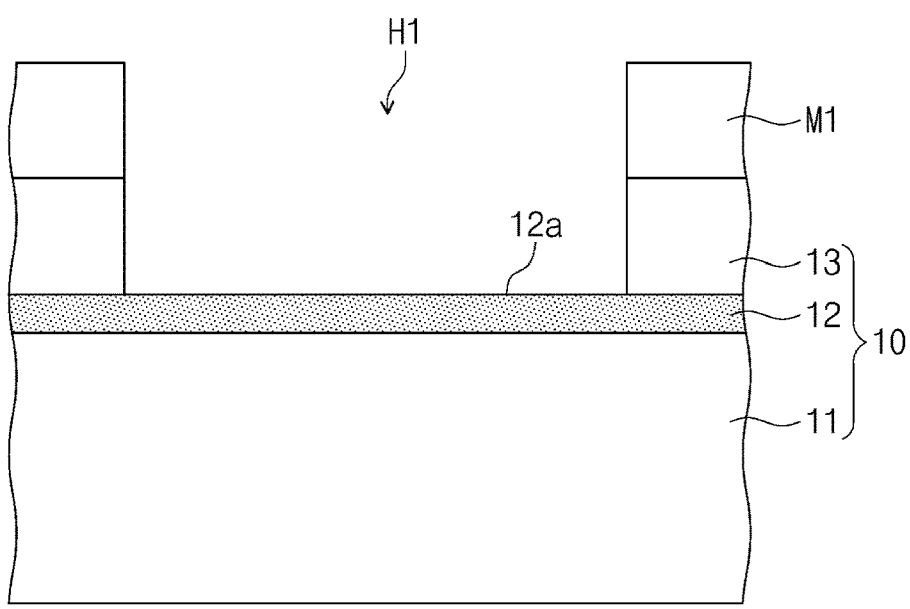

Referring to FIG. 4, a first hole H1 may be formed in the substrate 10. For example, after a first mask pattern M1 for exposing the second semiconductor layer 13 is formed on the substrate 10, the first hole H1 may be formed by etching the second semiconductor layer 13. The etching process of the second semiconductor layer 13 may be performed by dry etching including a reactive ion etching (ME) process, a magnetically enhanced reactive ion etching (MERLE) process, or an inductive coupled plasma (ICP) etching process. The first hole H1 may expose a top surface 12a of the insulation layer 12.

Figure 5:
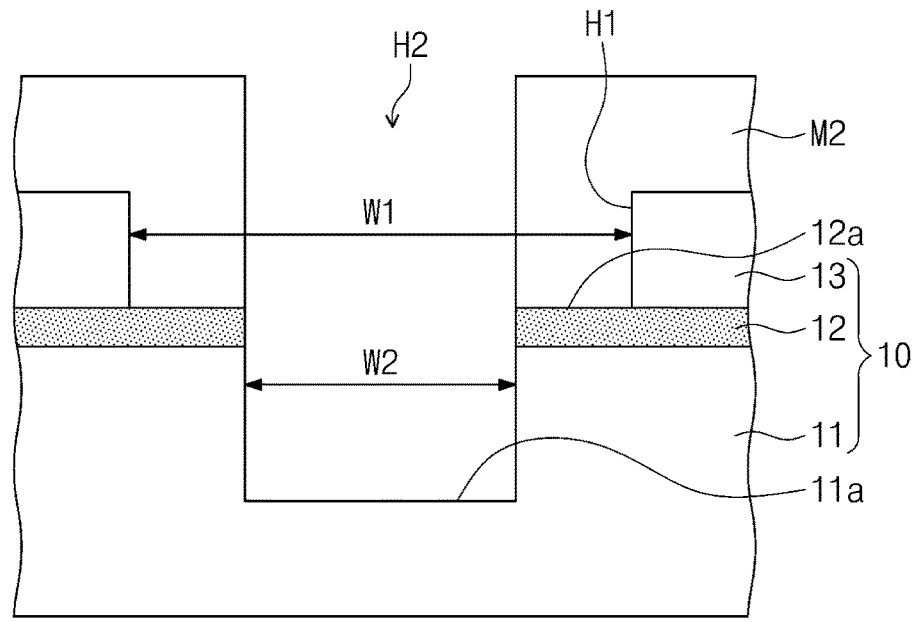

Referring to FIG. 5, after the first mask pattern M1 is removed, a second hole H2 may be formed in the substrate 10. For example, after a second mask pattern M2 for exposing the top surface 12a of the insulation layer 12 is formed on the second semiconductor layer 13, a second hole H2 may be formed by etching the insulation layer 12 and a portion of the first semiconductor layer 11. The etching process of the insulation layer 12 and the etching process of the first semiconductor layer 11 may be performed by dry etching including the RIE process, the MERLE process, or the ICP etching process. In the etching process of the insulation layer 12 and the etching process of the first semiconductor layer 11, different etching gases may be used. Here, the second mask pattern M2 may cover a portion of the exposed insulation layer 12. Therefore, a width W2 of the second hole H2 may be smaller than a width W1 of the first hole H1. The second hole H2 may penetrate through the insulation layer 12 and extend into the first semiconductor layer 11 to expose one surface 11a of the first semiconductor layer 11.

Figure 6:
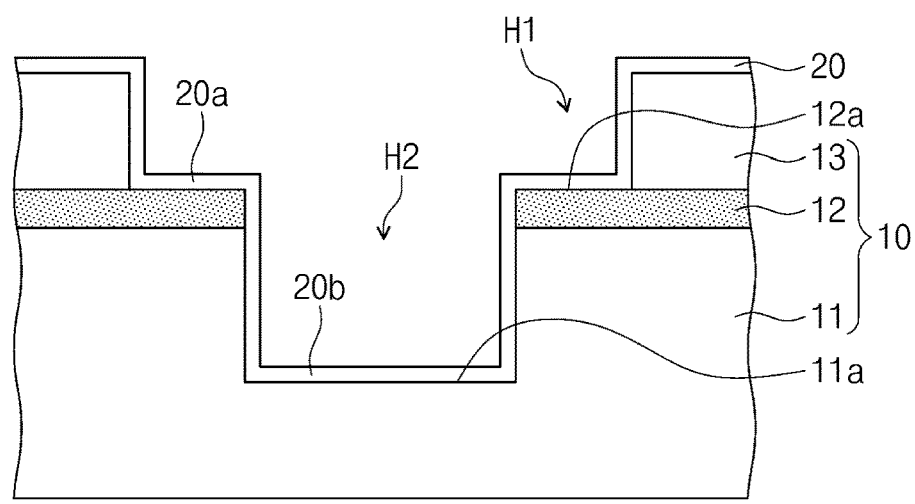

Referring to FIG. 6, after the second mask pattern M2 is removed, a spacer layer 20 may be formed on the substrate 10. For example, the spacer layer 20 may be formed by applying silicon nitride ($SiN_x$) to cover a top surface of the second semiconductor layer 13, an inner wall and a bottom surface of the first hole H1 (where, the bottom surface of the first hole H1 may be equal to the top surface 12a of the insulation layer 12. Hereinafter, the same reference numeral will be used.), and an inner wall and a bottom surface of the second hole H2 (where, the bottom surface of the second hole H2 may be equal to the one surface 11a of the first semiconductor layer 11. Hereinafter, the same reference numeral will be used). The spacer layer 20 may conformally cover the top surface of the second semiconductor layer 13, the inner wall and the bottom surface of the first hole H1, and the inner wall and the bottom surface 11a of the second hole H2. The spacer layer 20 may have a first part 20a positioned on the bottom surface 12a of the first hole H1 and a second part 20b positioned on the bottom surface 11a of the second hole H2.

Figure 7:
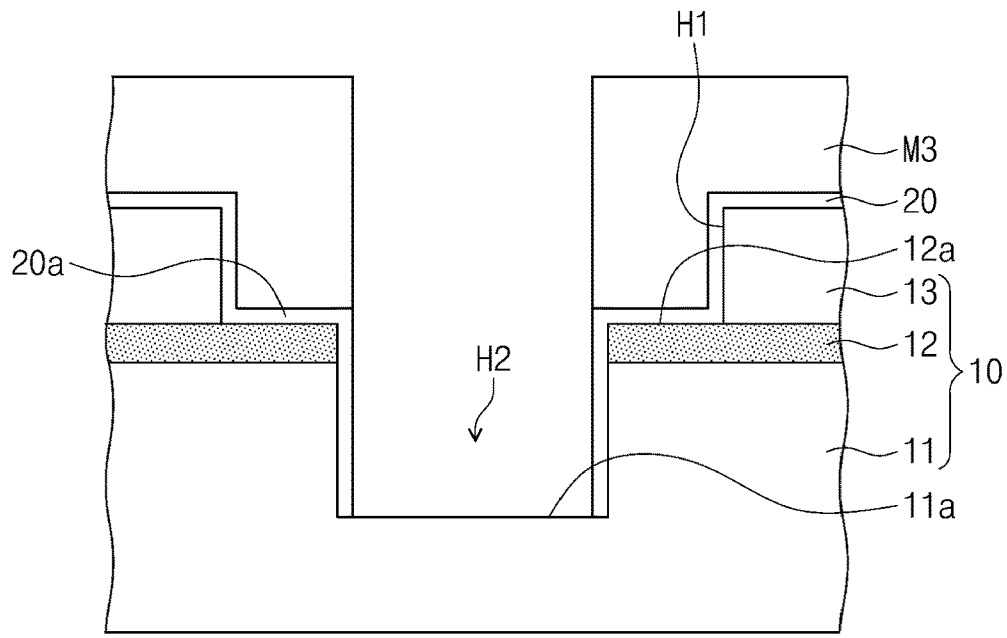

Referring to FIG. 7, a portion of the spacer layer 20 may be etched. For example, after a third mask pattern M3 for exposing the second part 20b is formed on the spacer layer 20, the second part 20b may be etched. Accordingly, the spacer layer 20 may expose the one surface 11a of the first semiconductor layer 11.

Figure 8:
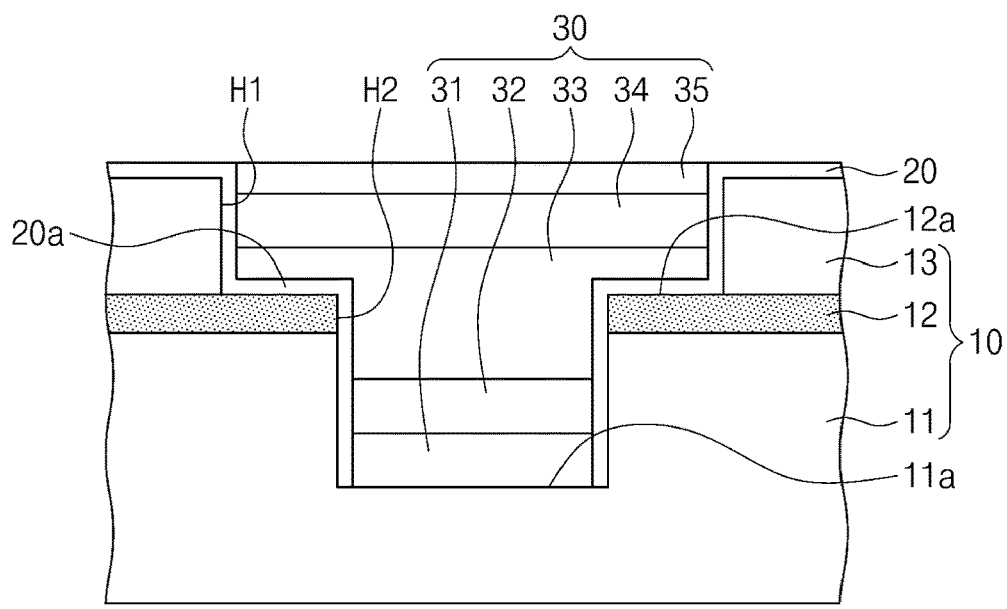

Referring to FIG. 8, after the third mask pattern M3 is removed, an epi-layer 30 may be formed inside the first hole H1 and the second hole H2. The epi-layer 30 may include a buffer layer 31, an ohmic contact layer 32, a drift layer 33, a channel layer 34, and a barrier layer 35. For example, the buffer layer 31 may be formed on the one surface 11a of the first semiconductor layer 11 which is exposed through the spacer layer 20. The buffer layer 31 may be formed, for one example, by a selective epitaxial growth (SEG) process in which the first semiconductor layer 11 is used as a seed. Here, since only the one surface 11a of the first semiconductor layer 11 is exposed through the spacer layer 20, a growth direction during the SEG process may be a direction perpendicular to the one surface 11a of the first semiconductor layer 11. Alternatively, in some cases, after a seed layer is formed on the one surface 11a of the first semiconductor layer 11 which is exposed through the spacer layer 20, the buffer layer 31 may be formed using an SEG process in which the seed layer is used as a seed. Then, by using the SEG process, the ohmic contact layer 32, the drift layer 33, the channel layer 34, and the barrier layer 35 may be sequentially formed on the buffer layer 31. That is, the epi-layer 30 grows from the bottom surface 11a of the second hole H2, and the top surface of the epi-layer 30 may be positioned at a level higher than the insulation layer 12. Here, the ohmic contact layer 32 may be formed so that a top surface thereof has a level lower than the insulation layer 12, and the drift layer 33 may grow from the top surface of the ohmic contact layer 32 so that a top surface thereof has a level higher than the insulation layer 12. The buffer layer 31 may alleviate a stress caused by different lattice constants of the first semiconductor layer 11 and the ohmic contact layer 32. The buffer layer 31 may include gallium nitride (GaN). The ohmic contact layer 32 may include $n^+$-type gallium nitride ($n^+$-GaN). The drift layer 33 may include n-type gallium nitride (n-GaN). The channel layer 34 may include gallium nitride (GaN). The barrier layer 35 includes aluminum gallium nitride (AlGaN).

On the other hand, the epi-layer 30 may be formed by various methods such as a chemical vapor deposition (CVD), and in this case, the spacer layer 20 may be omitted.

Figure 9:
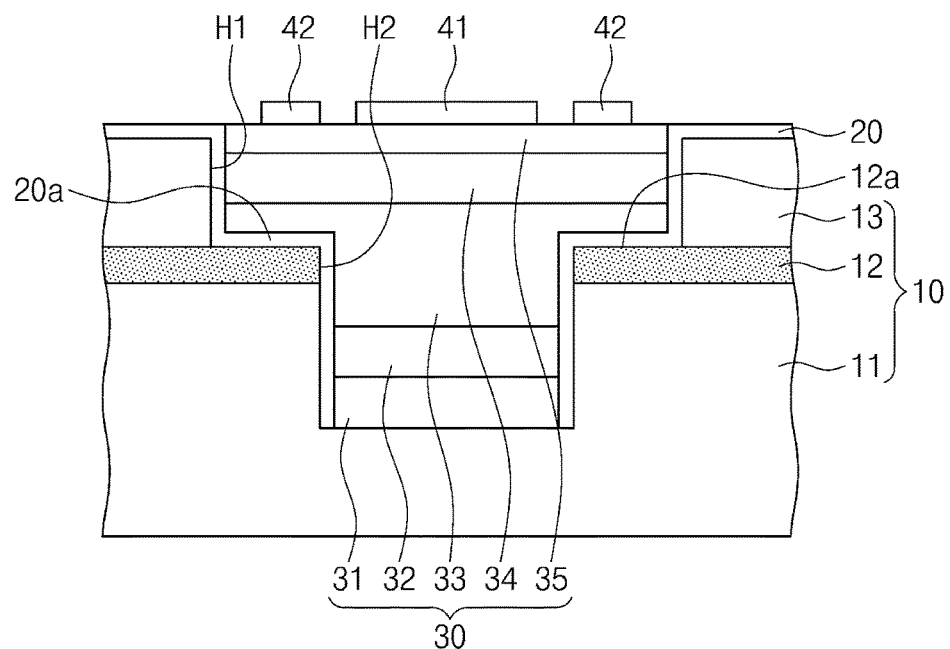

Referring to FIG. 9, a gate electrode 41 and source electrodes 42 may be formed on the barrier layer 35. For example, after a multi-layered metal film is formed on a top surface of the barrier layer 35, the gate electrode 41 and the source electrodes 42 may be formed by patterning the multi-layered metal film. The multi-layered metal film may include titanium (Ti), platinum (Pt), aluminum (Al), nickel (Ni), or gold (Au). On the other hand, the gate electrode 41 and the source electrodes 42 may be formed separately. For example, the source electrodes 42 may be first formed first by performing rapid thermal process (RTP) on the ohmic metal depositing on the barrier layer 35. After the source electrodes 42 are formed, the gate electrode 41 may be formed by depositing a gate metal.

Figure 10:
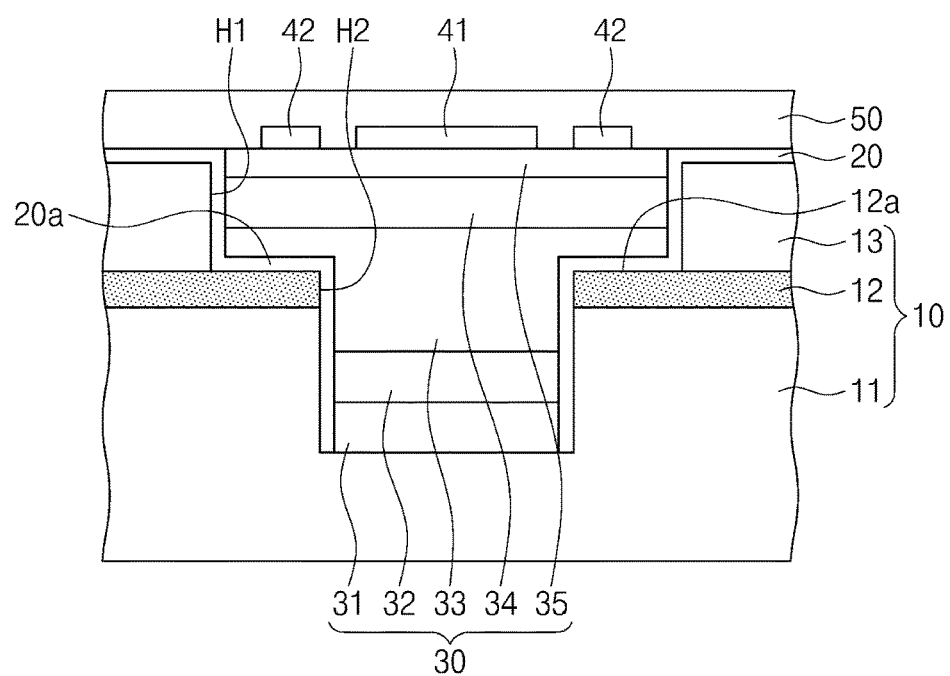

Referring to FIG. 10, a carrier substrate 50 may be provided on the substrate 10. The carrier substrate 50 may cover the barrier layer 35, the gate electrode 41, and source electrodes 42 on the second semiconductor layer 13. Although not illustrated, the carrier substrate 50 may be adhered to the substrate 10 by an adhesive layer. The carrier substrate 50 may protect the gate electrode 41 and the source electrodes 42 during a post-process, and support the substrate 10.

Although not illustrated, a thinning process for the substrate may be performed, if necessary. For example, the first semiconductor layer 11 is polished, and thus a thickness thereof may be reduced.

Figure 11:
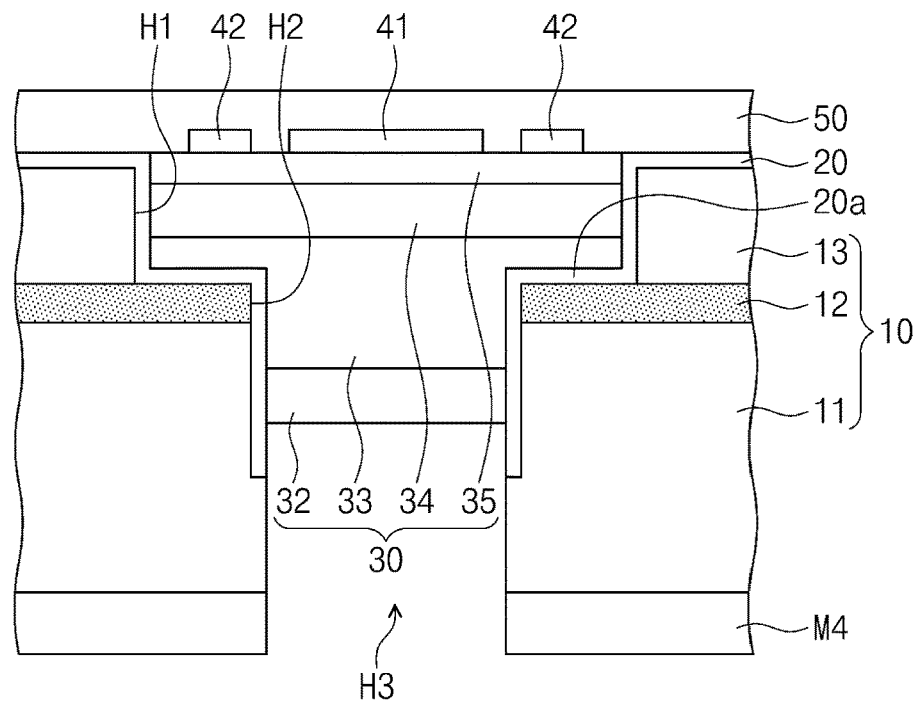

Referring to FIG. 11, a third hole H3 may be formed in the substrate 10. For example, after a fourth mask pattern M4 for exposing the first semiconductor layer 11 is formed on a bottom surface of the substrate 10, the third hole H3 may be formed by etching the first semiconductor layer 11. The etching process of the first semiconductor layer 11 may be performed by dry etching including the RIE process, the MERIE process, or the ICP etching process. The third hole H3 may be formed at the same position as the second hole H2 when viewed on a plane. The third hole H3 may penetrate through the first semiconductor layer 11 and be connected to the second hole H2. During the etching process of the first semiconductor layer 11, the buffer layer 31 may be etched together. Accordingly, the third hole H3 may expose a bottom surface of the ohmic contact layer 32.

Referring to FIG. 1 again, after the fourth mask pattern M4 is removed, a drain electrode 60 may be formed. The drain electrode 60 may be deposited under the substrate 10. For example, the drain electrode 60 may be formed by applying a metal layer to conformally cover a bottom surface of the first semiconductor layer 11, and inner walls and a bottom surface of the third hole H3 (where, the bottom surface of the third hole H3 may be equal to the bottom surface of the ohmic contact layer 32). The deposition of the drain electrode 60 may be performed by a sputtering method.

Then, the carrier substrate 50 is removed, and the semiconductor device described with reference to FIG. 1 may be manufactured.

In the method for manufacturing the semiconductor device according to embodiments of the inventive concept, the epi-layer 30 is formed to penetrate through the insulation layer of the substrate 10, and consequently an additional process for forming a current blocking layer may be unnecessary. Also, by forming the epi-layer 30 inside the through-hole H formed in the substrate 10 using a selective growth process, when the epi-layer 30, the first semiconductor layer 11, and the second semiconductor layer 13 of the substrate 10 have different materials, mutual integration between hetero semiconductor devices or integrated circuits on respective surfaces of the epi-layer 30, and the first and second semiconductor layers 11 and 13 may be possible. According to embodiments of inventive concept, the epi-layer 30 may be formed only on an active element region. Accordingly, when a plurality of semiconductor devices are formed on the epi-layer 30 of the substrate 10, an element isolation process for electrically isolating semiconductor devices may be unnecessary. That is, a process for manufacturing the semiconductor device may be simplified.

Figure 12:
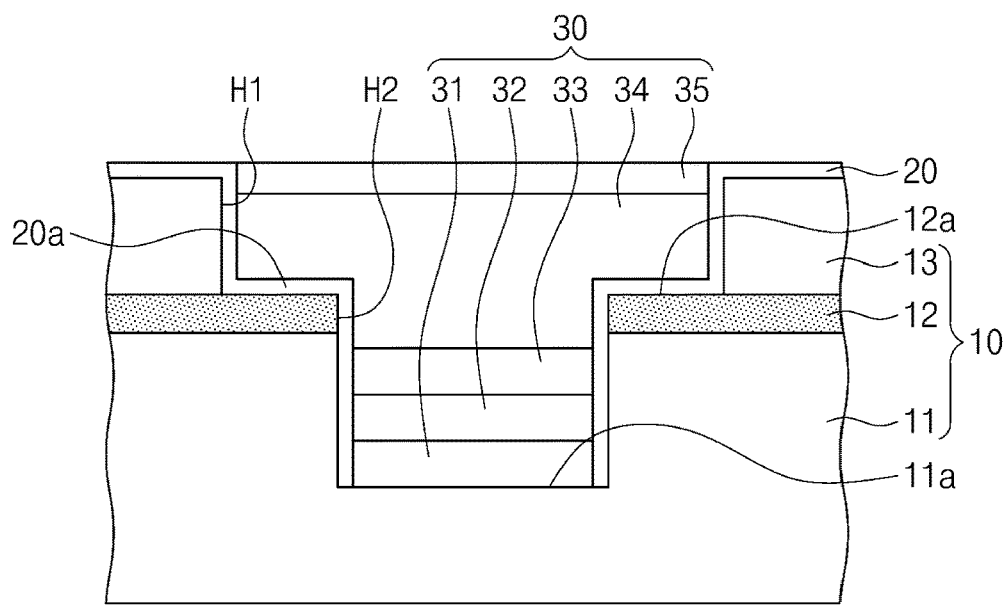
FIGS. 12 and 13 are cross-sectional views for explaining a method for manufacturing a semiconductor device according to embodiments of the inventive concept.
Figure 13:
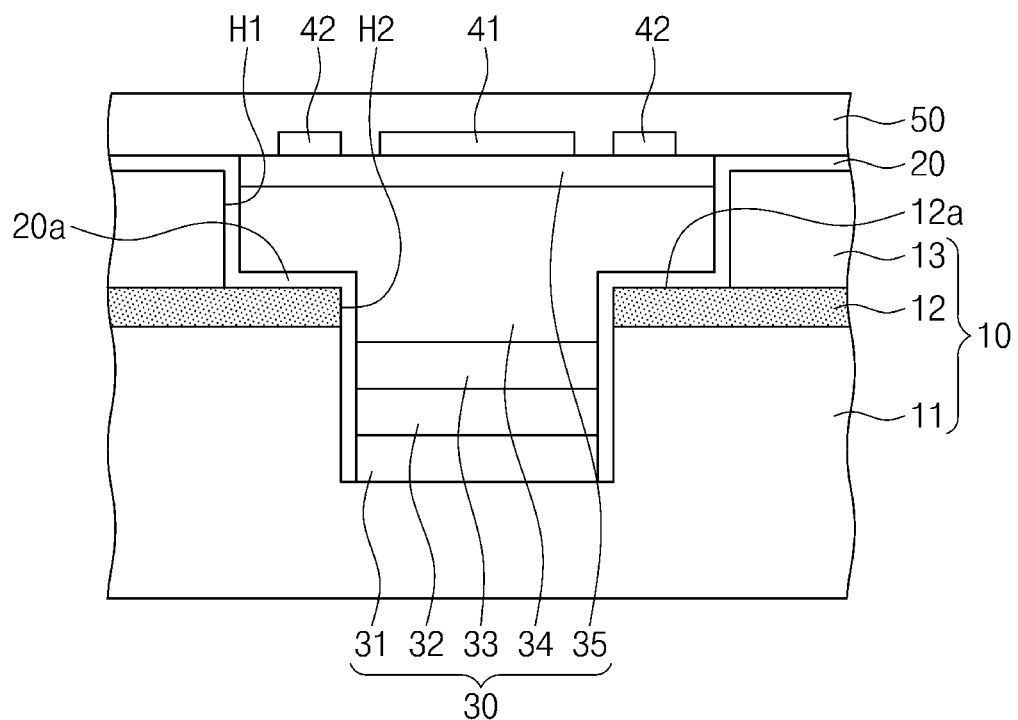

FIGS. 12 and 13 are cross-sectional views for explaining a method for manufacturing a semiconductor device according to embodiments of the inventive concept.

Referring to FIG. 12, after the third mask pattern M3 is removed from the result of FIG. 7, an epi-layer 30 may be formed inside the first hole H1 and the second hole H2. The epi-layer 30 may include a buffer layer 31, an ohmic contact layer 32, a drift layer 33, a channel layer 34, and a barrier layer 35. For example, the buffer layer 31 may be formed using a selective epitaxial growth (SEG) process in which the one surface 11a of the first semiconductor layer 11, which is exposed through the spacer layer 20, is used as a seed. By using the SEG process, the ohmic contact layer 32, the drift layer 33, the channel layer 34, and the barrier layer 35 may be sequentially formed on the buffer layer 31. Here, the drift layer 33 may be formed so that a top surface thereof has a level lower than the insulation layer 12, and the channel layer 34 may grow from the top surface of the drift layer 33 so that a top surface thereof has a level higher than the insulation layer 12.

Referring to FIG. 13, a gate electrode 41 and source electrodes 42 may be formed on a top surface of the barrier layer 35. For example, after a pattern for manufacturing the gate electrode 41 and the source electrodes 42 is formed on the top surface of the barrier layer 35, the gate electrode 41 and the source electrodes 42 may be formed by performing deposition of a multi-layered metal film and a lift-off process.

Then, a carrier substrate 50 may be provided on the substrate 10. The carrier substrate 50 may cover the barrier layer 35, the gate electrode 41, and source electrodes 42 on a second semiconductor layer 13.

Referring to FIG. 2 again, the third hole H3 may be formed in the substrate 10. The third hole H3 may penetrate through the first semiconductor layer 11 and be connected to the second hole H2. During the etching process of the first semiconductor layer 11, the buffer layer 31 may be etched together.

The drain electrode 60 may be formed under the substrate 10. For example, the drain electrode 60 may be formed by applying the metal layer to conformally cover the bottom surface of the first semiconductor layer 11, and inner walls and the bottom surface of the third hole H3.

Then, the carrier substrate 50 is removed, and the semiconductor device described with reference to FIG. 2 may be manufactured.

The current blocking layer for allowing the current to vertically flow between the source electrodes and the drain electrode of the semiconductor may be unnecessary. That is, the structure of the semiconductor device may be simplified. When the epi-layer, the first semiconductor layer, and the second semiconductor layer include different materials, the mutual integration between hetero semiconductor devices or integrated circuits on respective surfaces of the epi-layer, and the first and second semiconductor layers may be possible. According to the embodiments of the inventive concept, the epi-layer may be formed only on the active element region. In this case, when the plurality of semiconductor devices are formed on the epi-layer of the substrate, the element isolation process for electrically isolating semiconductor devices may be unnecessary. That is, the process for manufacturing the semiconductor device may be simplified.

In the method for manufacturing the semiconductor device according to the embodiments of the inventive concept, the additional process for forming the current blocking layer may be unnecessary. Also, when the plurality of semiconductor devices are formed on the substrate, the element isolation process for electrically isolating semiconductor devices may be unnecessary. That is, the process for manufacturing the semiconductor device may be simplified.

Although the embodiments of the inventive concept are described with reference to the accompanying drawings, those with ordinary skill in the technical field to which the inventive concept pertains will understand that the present disclosure can be carried out in other specific forms without changing the technical idea or essential features. Thus, the above-described embodiments are to be considered illustrative and not restrictive to all aspects.

What is claimed is:

1. A semiconductor device comprising:
    a substrate in which an insulation layer is disposed between a first semiconductor layer and a second semiconductor layer;
    a through-hole penetrating through the substrate, the through-hole having a first hole penetrating through the first semiconductor layer and a second hole penetrating through the insulation layer and the second semiconductor layer from a bottom surface of the first hole;
    an epi-layer disposed inside the through-hole;
    a drain electrode disposed inside the second hole and contacting one surface of the epi-layer; and
    a source electrode and a gate electrode which are disposed on the other surface of the epi-layer.

2. The semiconductor device of claim 1, wherein a bottom surface of the epi-layer is positioned at a level lower than the insulation layer, and
    a top surface of the epi-layer is positioned at a level higher than the insulation layer.

3. The semiconductor device of claim 1, wherein the epi-layer comprises an ohmic contact layer, a drift layer, a channel layer, and a barrier layer, which are sequentially stacked from the drain electrode.

4. The semiconductor device of claim 3, wherein the drift layer is disposed at a boundary between the first hole and the second hole, wherein
    a top surface of the drift layer is positioned at a level higher than the insulation layer, and
    a bottom surface of the drift layer is positioned at a level lower than the insulation layer.

5. The semiconductor device of claim 3, wherein the channel layer is disposed at a boundary between the first hole and the second hole, wherein
    a top surface of the channel layer is positioned at a level higher than the insulation layer, and
    a bottom surface of the channel layer is positioned at a level lower than the insulation layer.

6. The semiconductor device of claim 3, wherein the barrier layer comprises AlGaN, AlN, InN, InAlN, or AlGaInN, and
    the channel layer comprises GaN.

7. The semiconductor device of claim 1, further comprising a spacer layer disposed between the epi-layer and an inner wall of the through hole.

8. The semiconductor device of claim 1, wherein a width of the first hole is greater than a width of the second hole.

9. A method for manufacturing a semiconductor device, the method comprising:
    providing a substrate in which an insulation layer is disposed between a first semiconductor layer and a second semiconductor layer;
    etching the second semiconductor layer to form a first hole that exposes the insulation layer;
    etching the exposed insulation layer to form a second hole that extends into the first semiconductor layer;
    growing an epi-layer on a bottom surface of the second hole;
    forming a source electrode and a gate electrode on a top surface of the epi-layer;
    etching the first semiconductor layer to form a third hole that is connected to the second hole; and forming a drain electrode that extends from one surface of the first semiconductor layer into the third hole and contacts the epi-layer.

10. The method of claim 9, before growing of the epi-layer, further comprising forming a spacer layer that covers an inner wall and a bottom surface of the first hole and an inner wall of the second hole.

11. The method of claim 9, wherein the epi-layer comprises a buffer layer, an ohmic contact layer, a drift layer, a channel layer, and a barrier layer, which are sequentially stacked from the bottom surface of the second hole.

12. The method of claim 11, wherein during etching of the first semiconductor layer to form the third hole, the buffer layer is removed together with a portion of the first semiconductor layer.

13. The method of claim 11, wherein a boundary surface between the channel layer and the barrier layer is disposed at a level higher than the insulation layer.

14. The method of claim 9, before forming of the third hole, further comprising polishing the first semiconductor layer.

15. The method of claim 9, wherein a width of the first hole is greater than a width of the second hole.

\* \* \* \* \*